United States Patent [19]

Kondou et al.

[11] Patent Number: 5,021,745
[45] Date of Patent: Jun. 4, 1991

[54] DIFFERENCE AMPLIFIER CIRCUIT

[75] Inventors: Kenji Kondou; Manabu Ando, both of Tokyo, Japan

[73] Assignee: NEC Corporation, Tokyo, Japan

[21] Appl. No.: 454,876

[22] Filed: Dec. 21, 1989

[30] Foreign Application Priority Data

Dec. 21, 1988 [JP] Japan .............................. 63-324184

[51] Int. Cl.⁵ ............................................. H03F 3/45
[52] U.S. Cl. ...................................... 330/253; 330/261
[58] Field of Search ................ 330/253, 261; 307/355, 307/356

[56] References Cited
U.S. PATENT DOCUMENTS 4,533,877 8/1985 Rahim ............................ 330/261 X

*Primary Examiner*—James B. Mullins
*Attorney, Agent, or Firm*—Sughrue, Mion, Zinn, Macpeak & Seas

[57] ABSTRACT

A difference amplifier circuit comprises two series combinations coupled in parallel between a first source of voltage and a common node, an activation transistor responsive to a control signal for propagating a second voltage level to the common node and a channel conductance regulating circuit responsive to the control signal and operative to regulate channel conductances of the respective series combinations, so that the channel conductances are easily fallen within a target range through the function of the regulating circuit even if the process conditions are fluctuated.

6 Claims, 5 Drawing Sheets

TO P-CHANNEL FIELD EFFECT TRANSISTORS
QP11 AND QP12

5,021,745

DIFFERENCE AMPLIFIER CIRCUIT

FIELD OF THE INVENTION

This invention relates to a difference amplifier circuit and, more particularly, to a channel conductance regulating circuit incorporated in the difference amplifier circuit for achievement of a target gain regardless of process conditions.

DESCRIPTION OF THE RELATED ART

A typical example of the difference amplifier circuit is illustrated in FIG. 1, and is coupled between a source of positive voltage source Vdd and a ground node. The difference amplifier circuit comprises two series combinations of p-channel type field effect transistors QP1 and QP2 and n-channel type field effect transistors QN1 and QN2 as well as an n-channel type field effect transistor QN3. The gate electrodes of the p-channel type field effect transistors QP1 and QP2 are grounded, and a small difference in voltage level between two input nodes IN1 and IN2 is supplied to the gate electrodes of the n-channel type field effect transistors QN1 and QN2. Between the common source node CSN of the n-channel type field effect transistors QN1 and QN2 and the ground node is coupled the n-channel type field effect transistor QN3 which is supplied at the gate electrode thereof with a control signal CTL. A pair of output nodes OUT1 and OUT2 are provided on the common drain nodes of the series combinations, and a large difference in voltage level takes place between the output nodes OUT1 and OUT2.

The circuit behavior is described hereinbelow. If slightly different voltage levels Vin1 and Vin2 are supplied to the input nodes IN1 and IN2 and, then, the control signal CTL goes up to a positive high voltage level, the difference amplifier circuit is activated and starts on the difference amplification. If the voltage level Vin1 is larger than the voltage level Vin2, the gate-source voltages of the n-channel type field effect transistors QN1 and QN2 are given as follows $$Vin1 - Vs > Vin2 - Vs \quad \text{(Equation 1)}$$

where Vs is the source voltage level at the common source node CSN. The channel conductances g1 and g2 of the field effect transistors QN1 and QN2 are respectively proportional to the gate-source voltages, and, for this reason, the n-channel type field effect transistor QN1 is larger in channel conductance than the n-channel type field effect transistor QN2. The n-channel type field effect transistor QN1 with the large channel conductance decreases the voltage level Vout1 at the output node OUT1 faster than the voltage level Vout2 at the output node OUT2, and, for this reason, the output node OUT1 becomes lower in voltage level than the output node OUT2. Thus, a large difference in voltage level takes place between the output nodes OUT1 and OUT2, and a gain G of the difference amplifier is represented as:

$$(Vout2 - Vout1)/(Vin1 - Vin2) \quad \text{(Equation 2)}$$

The gain G is decided by using the channel conductances g1 and g2 as well as channel conductances of the p-channel type field effect transistors QP1 and QP2 as a ration therebetween, and, for this reason, the channel conductances g1 to g4 should be strictly adjusted to respective value for achieving a predetermined gain G. In an actual circuit, the channel conductances are directly related to the dimensions of the component transistors, and a dimensional error allowable is relatively small.

However, the process conditions of the semiconductor manufacturing are liable to fluctuate over the range allowable, and the gains of the difference amplifiers thus produced tend to be out of a target range. This results in reduction of the production yield.

Assuming now that the p-channel type field effect transistors QP1 and QP2 are increased in the channel conductance but the n-channel type field effect transistors QN1, QN2 and QN3 are decreased, the voltage level at the common source node CSN become higher than that of the usual difference amplifier circuit. However, the voltage levels at the input nodes IN1 and IN2 are not affected by the fluctuation of the process conditions, and, for this reason, the gate-source voltages of the n-channel type field effect transistors QN1 and QN2 are decreased with respect to those of the usual difference amplifier circuit. On the other hand, since the on-resistance of the n-channel type field effect transistors QN1 and QN2 are increased, the difference in voltage level between the output nodes OUT1 and OUT2 is decreased due to the voltage ascent. This results in that the gain of the difference amplifier circuit is out of the target range.

On the other hand, the channel conductances of the p-channel type field effect transistors QP1 and QP2 are decreased below the target value but the channel conductances of the n-channel type field effect transistors QN1 and QN2 are increased, the output voltage levels Vout1 and Vout2 are lowered with respect to those of the usual difference amplifier circuit, because the voltage level at the common source node CSN becomes lower and the on-resistance of the n-channel type field effect transistors QN1 and QN2 are decreased. Then, both of the voltage levels at the output nodes OUT1 and OUT2 are lowered, and the gain of the difference amplifier circuit is also out of the target range.

SUMMARY OF THE INVENTION

It is therefore an important object of the present invention to provide a difference amplifier circuit which is easy for achievement of a target gain.

It is also an important object of the present invention to provide a difference amplifier circuit which is easy for fabrication so that the production yield is enhanced.

To accomplish these objects, the present invention proposes to provide a channel conductance regulating circuit for the component transistors.

In accordance with the present invention, there is provided a difference amplifier circuit comprising a) a first series combination of a first transistor of a first channel conductivity type, a first output node and a second transistor of a second channel conductivity type coupled between a first source of voltage level and a common node, the first and second channel conductivity types being opposite to each other; b) a second series combination of a third transistor of the first channel conductivity type, a second output node and a fourth transistor of the second channel conductivity type coupled between the first source of voltage level and the common node in parallel to the first series combination, a small difference in voltage level being supplied between the gate electrodes of the second and fourth transistors for producing a large difference in voltage level between the first and second output nodes; c) an activation transistor of the second channel conductivity type coupled between the common node and a second source of voltage level different in voltage level from the first source of voltage level, the activation transistor turning on to provide a conduction path between the common node and the second source of voltage level in the presence of a control signal; and d) a channel conductance regulating circuit responsive to the control signal and operative to regulate channel conductances of the first and third transistors for achievement of a target gain, in which said channel conductance regulating circuit has a series combination of a plurality of field effect transistors of the first and second channel conductivity types coupled between the first and second sources of voltage level.

BRIEF DESCRIPTION OF THE DRAWINGS

The features and advantages of a difference amplifier circuit according to the present invention will be more clearly understood from the following description taken in conjunction with the accompanying drawings in which.

DESCRIPTION OF THE PREFERRED EMBODIMENTS

First Embodiment

Figure 1:
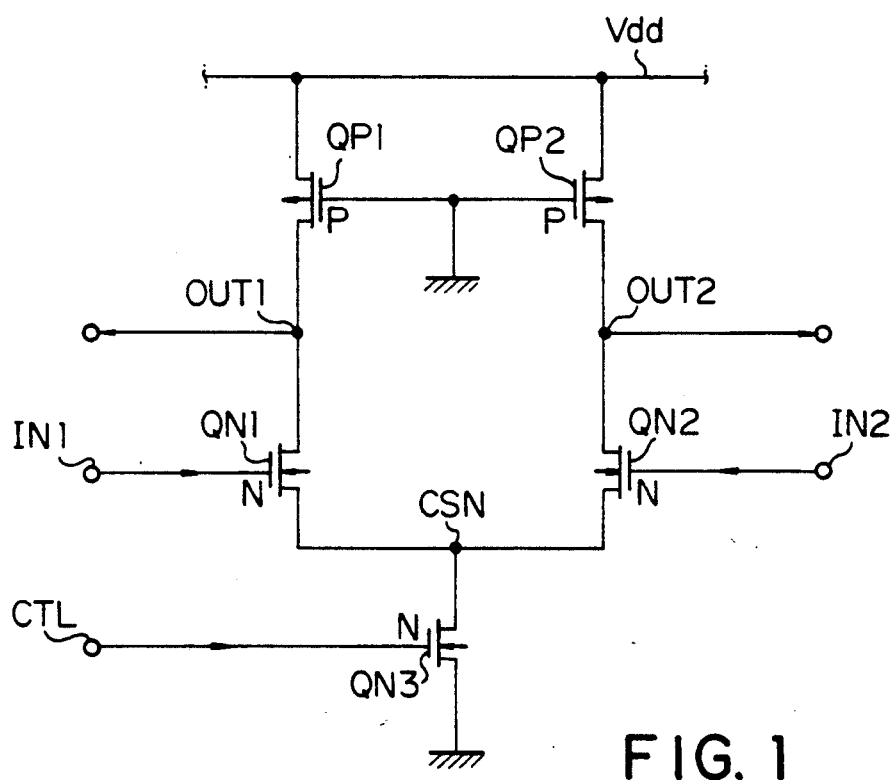
FIG. 1 is a circuit diagram showing the arrangement of a prior art difference amplifier circuit.
Figure 2:
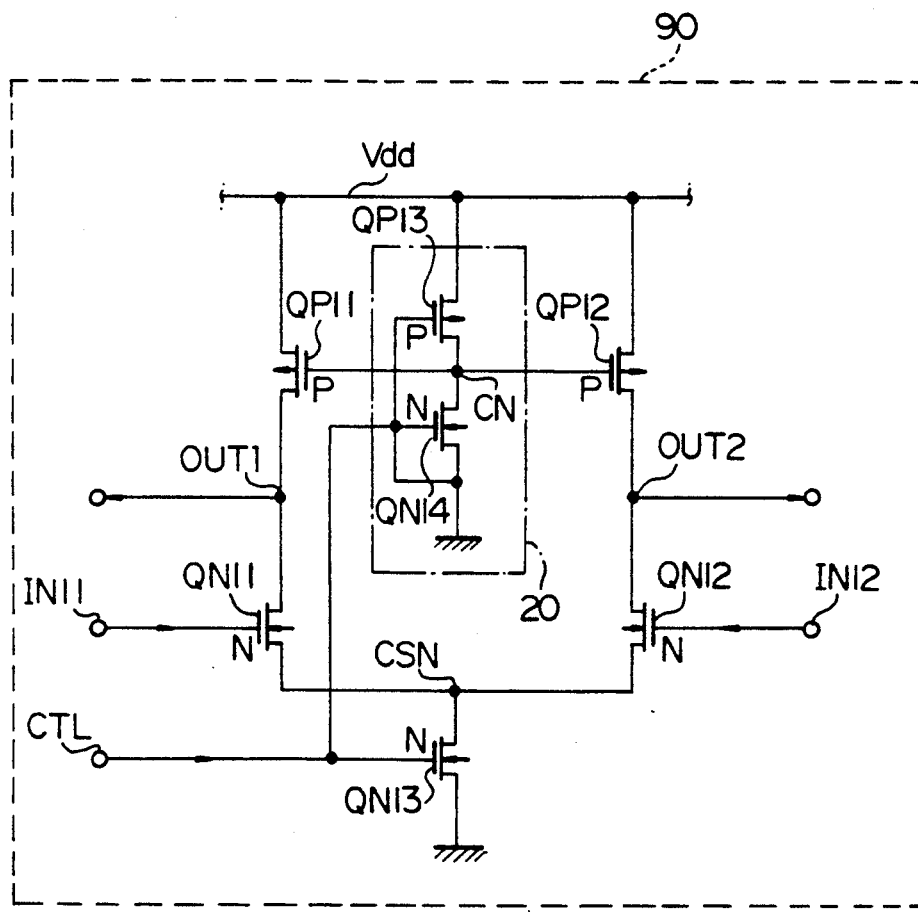
FIG. 2 is a circuit diagram showing the arrangement of a difference amplifier circuit embodying the present invention.

Referring first to FIG. 2 of the drawings, a difference amplifier circuit embodying the present invention comprises first and second series combinations of p-channel type field effect transistors QP11 and QP12 and n-channel type field effect transistors QN11 and QN12 coupled in parallel between a source of positive voltage level Vdd and a common source node CSN, an activation transistor implemented by an n-channel type field effect transistor QN13 and coupled between the common source node CSN and a ground node, and a channel conductance regulating circuit 20 implemented by a third series combination of a p-channel type field effect transistor QP13 and an n-channel type field effect transistor QN14 and coupled between the source of the positive voltage level Vdd and the ground node. All of the component elements are fabricated on a single semiconductor chip 90. The common drain nodes of the first and second series combinations serve as first and second output nodes OUT1 and OUT2, respectively. The gate electrodes of the n-channel type field effect transistors QN11 and QN12 provide first and second input nodes IN11 and IN12, and a small difference in voltage level is supplied between the first and second input nodes IN11 and IN12. A control signal CTL is supplied to not only the gate electrode of the n-channel type field effect transistor QN13 for activating the difference amplifier circuit but also the gate electrodes of the p-channel type and n-channel type field effect transistors QP13 and QN14. The common drain node of the field effect transistors QP13 and QN14 serves as a control node CN coupled to the gate electrodes of the p-channel type field effect transistors QP11 and QP12.

The circuit behavior is described hereinbelow on the assumption that the input node IN11 is slightly higher in voltage level than the input node IN12. When the slightly different voltage levels Vin1 and Vin2 are supplied to the input nodes IN11 and IN12 and, then, the control signal CTL goes up to a positive high voltage level, the activation transistor QN13 turns on and activates the difference amplifier circuit. Then, the difference amplifier circuit starts on the difference amplification. Since the channel conductances of the n-channel type field effect transistors QN11 and QN12 are proportional to the gate-source difference voltages thereof, the output node 1 decreased in voltage level faster than the output node 2, and, for this reason, the output node OUT1 becomes lower in voltage level than the output node OUT2. Thus, a large difference in voltage level takes place between the output nodes OUT1 and OUT2.

The channel conductance regulating circuit 20 is activated in the presence of the control signal CLT, and provides a voltage level to the gate electrodes of the p-channel type field effect transistors QP11 and QP12. The channel conductances of the p-channel type field effect transistors QP11 and QP12 are in inverse proportion to the voltage level at the gate electrodes thereof which is in proportion to the channel conductance of the p-channel type field effect transistor QP13. In the semiconductor manufacturing process, all of the p-channel type field effect transistors are simultaneously formed and n-channel type field effect transistors are also simultaneously formed at a different stage from the p-channel type field effect transistors, so that all of the p-channel type field effect transistors or the n-channel type field effect transistors are affected by fluctuations of the process conditions. Assuming now that the fluctuations of the process conditions decrease potential channel conductances of all of the p-channel type field effect transistors QP11, QP12 and QP13 and that all of the n-channel type field effect transistors are decreased in potential channel conductance, the channel conductance of the p-channel type field effect transistor QP13 is actually decreased in the operation, and, for this reason, the voltage level at the control node CN slightly goes up, and, causes the p-channel type field effect transistors QP11 and QP12 to have the actual channel conductances within a target range regardless of the increment of the potential channel conductances. This results in that a gain of the difference amplifier circuit is fallen within a target range.

If, on the other hand, the fluctuations of the process conditions are causative of decrease of the potential channel conductances of the p-channel type field effect transistors QP11, QP12 and QP13 but the n-channel type field effect transistors are increased in potential channel conductance, the voltage level at the control node CN slightly goes down for compensating the decrement of the potential channel conductances of the p-channel type field effect transistors QP11 and QP12. Since the ratios of the actual channel conductances between the p-channel and the n-channel type field effect transistors QP11, QP12, QN11 and QN12 decide the gain of the difference amplifier circuit, the gain is node drastically varied even if the process conditions are fluctuated.

Figure 3:
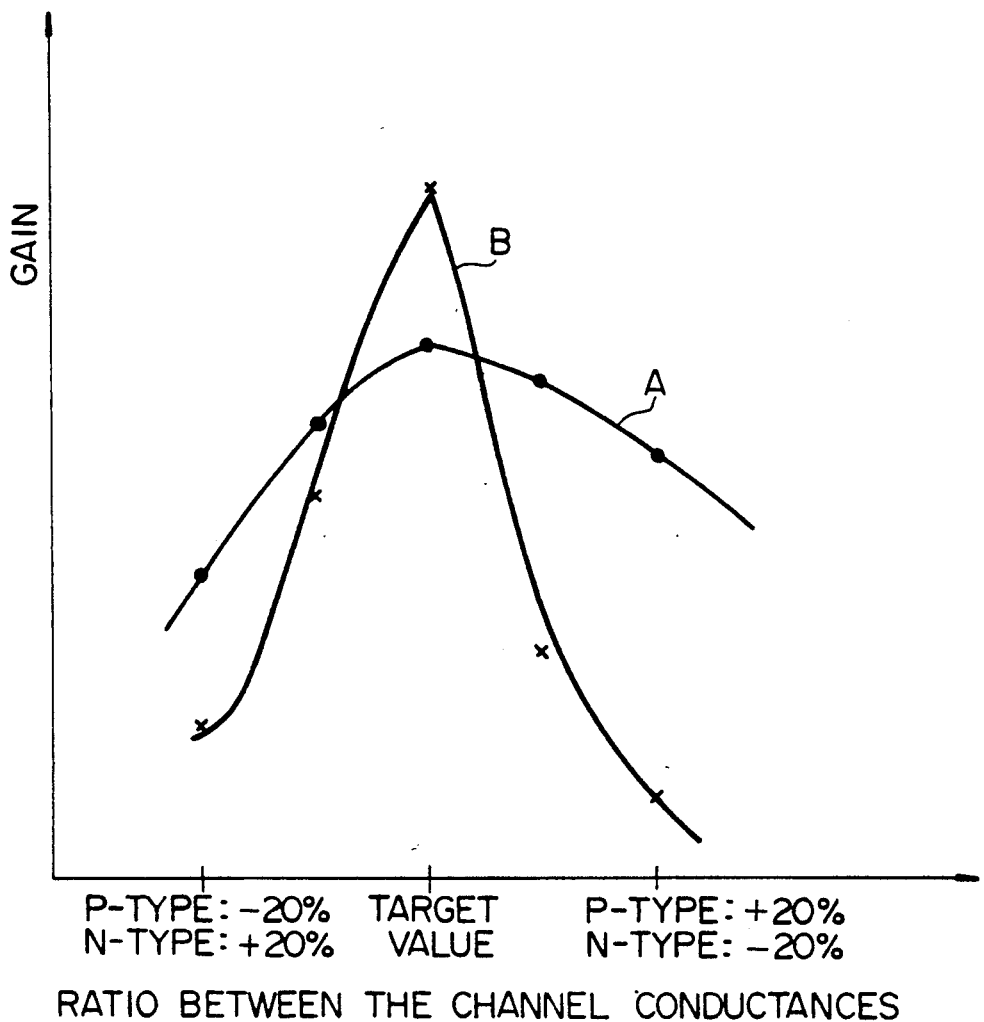
FIG. 3 is a graph showing the gains achieved by the prior art difference amplifier circuit and the difference amplifier circuit of the present invention in terms of the deviations of the channel conductance ratios.

Thus, the channel conductance regulating circuit 20 sets limitation on the fluctuations of the actual channel conductances, and, for this reason, the gain is easily fallen within the target range. FIG. 3 shows the gain in terms of the fluctuation of the ration between the channel conductances of the p-channel type field effect transistors and the n-channel type field effect transistors. Plots A indicate the gain achieved by the difference amplifier circuit according to the present invention, and plots B represent the gain achieved by the prior art difference amplifier circuit. Comparing plots A with plots B, it will be understood that the channel conductance regulating circuit is effective for achievement of the gain within the target range.

Second Embodiment

Figure 4:
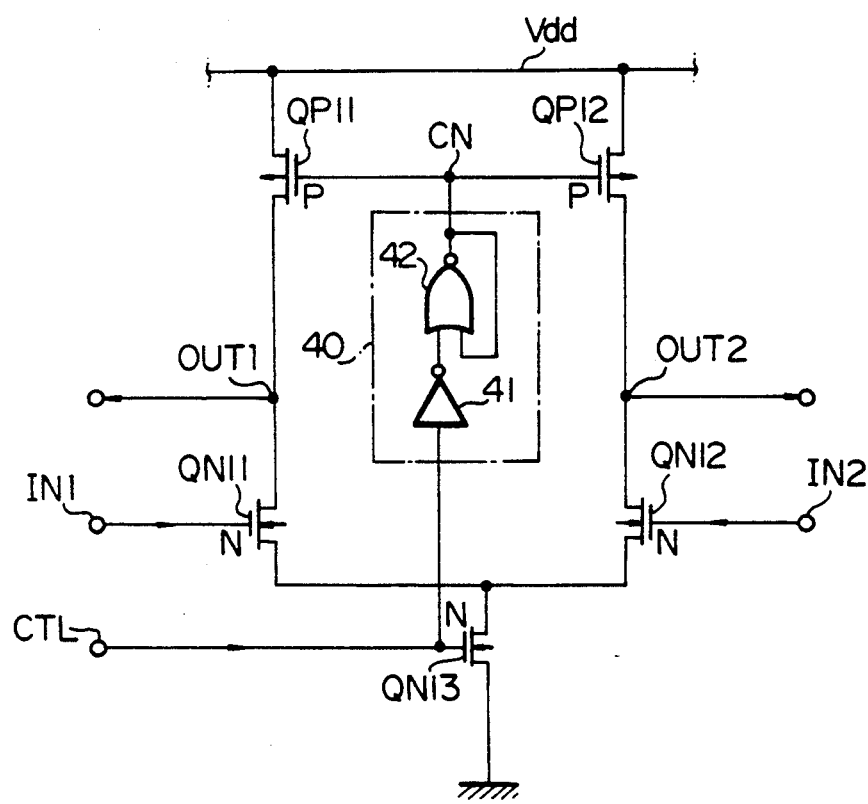
FIG. 4 is a circuit diagram showing the arrangement of another difference amplifier circuit embodying the present invention.

Turning to FIG. 4 of the drawings, there is shown another difference amplifier circuit according to the present invention. The difference amplifier circuit shown in FIG. 4 is similar in arrangement to the difference amplifier circuit shown in FIG. 2 with the exception of a channel conductance regulating circuit 40, and, for this reason, no description is incorporated for the other component elements for the sake of simplicity. These component transistors and nodes are designated by the same reference numerals used in FIG. 2.

Figure 5:
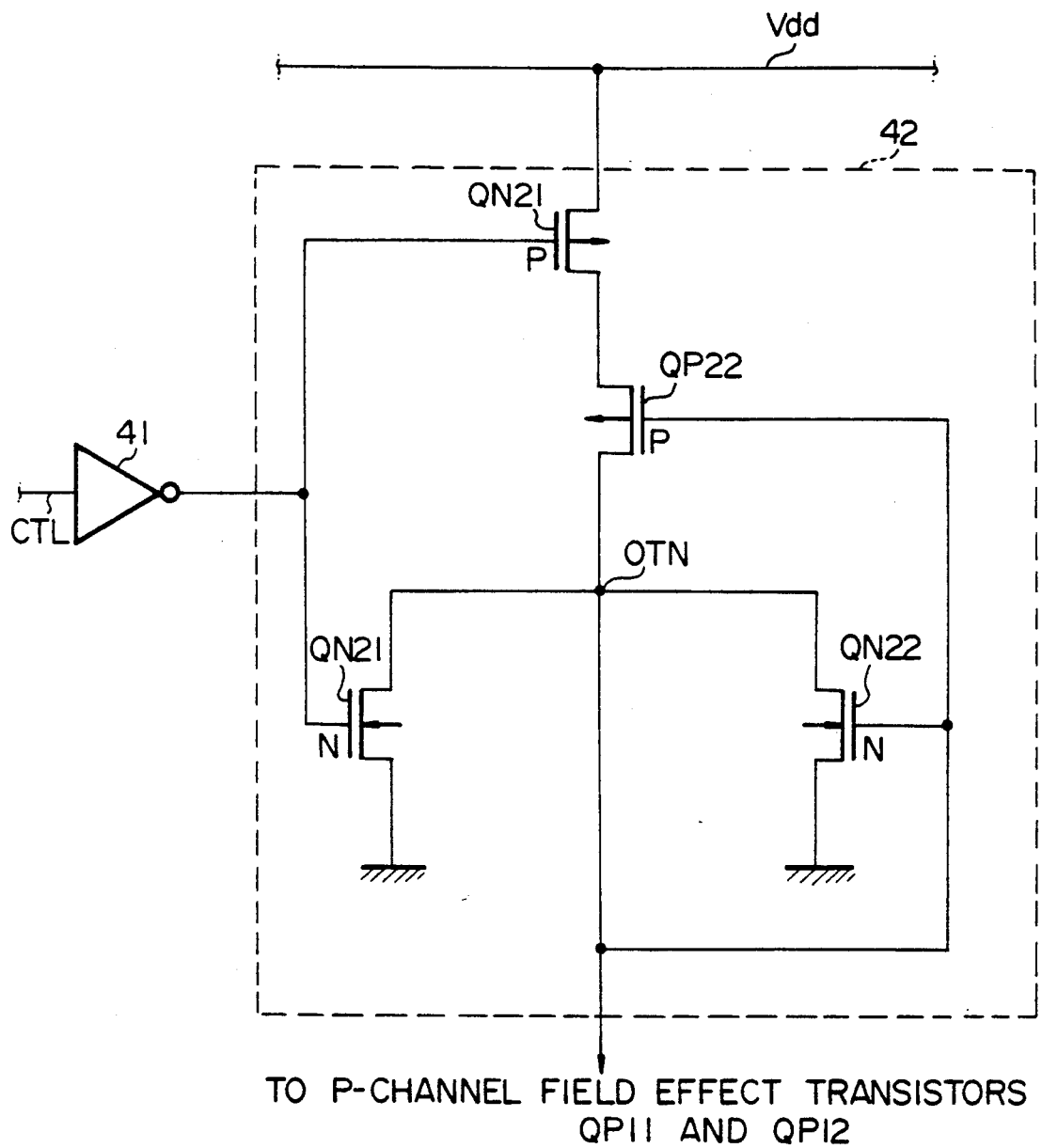
FIG. 5 is a circuit diagram showing the channel conductance regulating circuit incorporated in the difference amplifier circuit shown in FIG. 4.

The channel conductance regulating circuit 40 comprises an inverter circuit 41 and a NOR gate 42, and the control signal CTL is supplied to the inverter circuit 41. The output node of the inverter circuit 41 is coupled to one of the input nodes of the NOR gate 42, and the other input node is coupled to the output node of the NOR gate 42. The output node of the NOR gate 42 is further coupled to the gate electrodes of the p-channel type field effect transistors QP11 and QP12. As will be seen from FIG. 5, the NOR gate 42 comprises two p-channel type field effect transistors QP21 and QP22 coupled in series between the source of positive voltage level Vdd and the output node OTN of the NOR gate 42 and two n-channel type field effect transistors QN21 and QN22 coupled in parallel between the output node OTN and the ground node. The control signal CTL is supplied to the gate electrodes of the field effect transistors QP21 and QN21, and the voltage level at the output node OTN is affected by the channel conductances of the component transistors QP21, QP22, QN21 and QN22. In this instance, the p-channel type field effect transistors QP21 and QP22 regulate the channel conductances of the p-channel type field effect transistors QP11 and QP12 as similar to the channel conductance regulating circuit 20, so that the gain of the difference amplifier circuit is easily fallen within a target range.

The NOR gate 42 allows the control node CN to go down to the ground level in the absence of the control signal CTL, and, for this reason, the p-channel type field effect transistors QP11 and QP12 fully turn on. This prevents the output nodes OUT1 and OUT2 from the high impedance states, so that the undesirable noises due to, for example, coupling hardly affect.

Assuming now that the fluctuations of the process conditions decrease potential channel conductances of all of the p-channel type field effect transistors QP11, QP12, QP13, QP21 and QP22 and that all of the n-channel type field effect transistors are decreased in potential channel conductance, the channel conductance of the p-channel type field effect transistors QP21 and QP22 are actually decreased in the operation, and, for this reason, the voltage level at the control node OTN slightly goes up, and, causes the p-channel type field effect transistors QP11 and QP12 to have the actual channel conductance within a target range regardless of the increment of the potential channel conductance. This results in that a gain of the difference amplifier circuit is fallen within a target range.

If, on the other hand, the fluctuations of the process conditions are causative of decrease of the potential channel conductance of the p-channel type field effect transistors QP11, QP12, QP21 and QP22 but the n-channel type field effect transistors are increased in potential channel conductance, the voltage level at the control node OTN slightly goes down for compensating the decrement of the potential channel conductance of the p-channel type field effect transistors QP11 and QP12. Since the ratios of the actual channel conductance between the p-channel and the n-channel type field effect transistors QP11, QP12, QN11 and QN12 decide the gain of the difference amplifier circuit, the gain is drastically varied even if the process conditions are fluctuated.

Thus, the channel conductance regulating circuit 40 sets limitation on the fluctuations of the actual channel conductance, and, for this reason, the gain is easily fallen within the target range.

Although particular embodiments of the present invention have been shown and described, it will be obvious to those skilled in the art that various changes and modifications may be made without departing from the spirit and scope of the present invention.

What is claimed is:

1. A difference amplifier circuit comprising
   (a) a first series combination of a first transistor of a first channel conductivity type, a first output node and a second transistor of a second channel conductivity type coupled between a first source of voltage level and a common node, said first and second channel conductivity types being opposite to each other;
   (b) a second series combination of a third transistor of said first channel conductivity type, a second output node and a fourth transistor of said second channel conductivity type coupled between said first source of voltage level and said common node in parallel to said first series combination, a small difference in voltage level being supplied between the gate electrodes of said second and fourth transistors for producing a large difference in voltage level between said first and second output nodes;
   (c) an activation transistor of said second channel conductivity type coupled between said common node and a second source of voltage level different in voltage level from said first source of voltage level, said activation transistor turning on to provide a conduction path between said common node and said second source of voltage level in the presence of a control signal; and
   (d) a channel conductance regulating circuit responsive to said control signal and operative to regulate channel conductances of said first and third transistors for achievement of a target gain, in which said channel conductance regulating circuit is implemented by a third series combination of a fifth transistor of said first channel conductivity type, an output node coupled to the gate electrodes of said first and third transistors and a sixth transistor of said second channel conductivity type coupled between said first source of voltage level and said second source of voltage level, wherein said control signal is supplied to the gate electrodes of said fifth and sixth transistors.

2. A difference amplifier circuit as set forth in claim 1, in which said first and second channel conductivity types respectively represent a p-channel type and an n-channel type.

3. A difference amplifier circuit as set forth in claim 2, in which said first and second sources of voltage level respectively produce a positive voltage level and a ground voltage level.

4. A difference amplifier circuit as set forth in claim 1, in which said channel conductance regulating circuit comprises an inverter circuit supplied at the input node thereof with said control signal and NOR gate having a first input node coupled to the output node of the inverter circuit, a second input node coupled to an output node thereof and the output node coupled to the gate electrodes of said first and third transistors.

5. A difference amplifier circuit as set forth in claim 4, in which said first and second channel conductivity types respectively represent a p-channel type and an n-channel type.

6. A difference amplifier circuit as set forth in claim 5, in which said first and second sources of voltage level respectively produce a positive voltage level and a ground voltage level.

* * * * *